United States Patent
Park et al.

(10) Patent No.: US 8,042,350 B2
(45) Date of Patent: Oct. 25, 2011

(54) APPARATUS FOR CONTROLLING COOLING DEVICE AND COOLING SYSTEM

(75) Inventors: Young-Bae Park, Anyang (KR); Hyun-Min Cho, Seoul (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 791 days.

(21) Appl. No.: 11/486,904

(22) Filed: Jul. 14, 2006

(65) Prior Publication Data

US 2007/0017668 A1    Jan. 25, 2007

(30) Foreign Application Priority Data

Jul. 20, 2005    (KR) .................. 10-2005-0065934

(51) Int. Cl.
*F25D 23/12* (2006.01)
*F25B 15/00* (2006.01)
*F25B 21/02* (2006.01)
*H05K 7/20* (2006.01)

(52) U.S. Cl. ............. 62/259.2; 62/3.7; 62/104; 361/688

(58) Field of Classification Search .................. 361/688; 62/259.2, 3.7, 104.15

See application file for complete search history.

(56) References Cited

U.S. PATENT DOCUMENTS

| | | | | |
|---|---|---|---|---|
| 4,610,142 A * | 9/1986 | Davis | | 62/3.7 |
| 5,281,026 A * | 1/1994 | Bartilson et al. | | 374/143 |
| 6,978,624 B2 * | 12/2005 | Carlson et al. | | 62/3.7 |
| 2003/0071595 A1 * | 4/2003 | Cho et al. | | 318/599 |
| 2006/0268473 A1 * | 11/2006 | Kemper | | 361/56 |

* cited by examiner

*Primary Examiner* — Thomas Denion
*Assistant Examiner* — Michael Carton
(74) *Attorney, Agent, or Firm* — Sidley Austin LLP

(57) ABSTRACT

A cooling device controller for controlling a cooling device is provided. The cooling device controller includes: a capacitor for supplying an output voltage through a first terminal; a first switch between a first input terminal and the first terminal of the capacitor; a predetermined reference voltage applied to the first input terminal; a second switch between a second input terminal and the first terminal of the capacitor, wherein a temperature-sensing voltage is applied to the second input terminal, the temperature-sensing voltage varying according to a first sensed temperature; and a switch controller to receive a first voltage waveform having a duty ratio, the duty ratio dependent on a second sensed temperature, wherein the switch controller is operable to turn on and off the first switch and the second switch according to the duty ratio.

11 Claims, 12 Drawing Sheets

APPARATUS FOR CONTROLLING COOLING DEVICE AND COOLING SYSTEM

CROSS-REFERENCE TO RELATED APPLICATION

This application claims priority to and the benefit of Korean Patent Application No. 10-2005-0065934 filed in the Korean Intellectual Property Office on Jul. 20, 2005, the entire content of which is incorporated herein by reference.

BACKGROUND OF THE INVENTION (a) Field of the Invention

The present invention relates to a pulse width modulation decoder and a cooling device controller.

In particular, the present invention relates to a circuit for controlling a cooling device with a predetermined temperature appropriate for a system.

(b) Description of the Related Art

As personal computer systems have developed to have higher clock rates, clock frequencies for the systems have also increased and the systems' heat generation has become an important issue. As the clock frequency becomes higher, ICs such as a CPU and a memory generate much heat and they may be abnormally operated or be burned without suitable cooling.

Many systems use a cooling fan, which cools the system by circulating the air. The fan sends the system'heated air outside and supplies cold air in its place.

However, the cooling fan generates noise because of the turbulent air flow and the friction of the bearings. If the cooling fan is operated at fixed revolutions per minute (rpm), then for extended intervals it provides more cooling than necessary, accompanied by excess noise. Hence, many systems control the operational rpm of the cooling fan according to the temperature. Some of these systems use thermistors to reduce costs.

A thermistor changes its electrical resistance according to temperature. Accordingly, thermistors are classified as NTC thermistors (Negative Temperature Coefficient Thermistors) whose electrical resistance decreases as the temperature increases, and PTC thermistors (Positive Temperature Coefficient Thermistors) whose electrical resistance increases as the temperature increases.

Even when the temperature is sensed by using a thermistor and the rpm of the cooling fan is controlled accordingly, it is not easy to appropriately control the rpm of the cooling fan because of the nonlinear dependence of the thermistor'resistance on the temperature and the nonlinearly of temperature sensing caused by the thermistor peripheral circuits. Most of the systems control the rpm of the cooling fan to be greater than necessary, thus consuming excessive power and generating excessive noise.

SUMMARY OF THE INVENTION

Briefly and generally, in some embodiments a cooling device controller for controlling a cooling device for reducing a temperature of a system is provided, the cooling device controller including: a capacitor for supplying an output voltage through a first terminal; a first switch between a first input terminal and the first terminal of the capacitor, wherein a predetermined reference voltage is applied to the first input terminal; a second switch between a second input terminal and the first terminal of the capacitor, wherein a temperature-sensing voltage is applied to the second input terminal, the temperature-sensing voltage varying according to a first sensed temperature; and a switch controller, operable to receive a first voltage waveform having a duty ratio, the duty ratio dependent on a second sensed temperature, wherein the switch controller is operable to turn on and off the first switch and the second switch according to the duty ratio.

In some embodiments a cooling system includes: a cooling device for reducing a temperature of a system; a first temperature sensor operable to generate a first signal representing a first sensed temperature; a second temperature sensor, operable to generate a second signal having a duty ratio according to a second sensed temperature; a first power unit operable to provide a reference voltage; and a cooling device controller operable to receive the first signal, the second signal, and the reference voltage and to control the cooling device according to the received signals and voltage.

DETAILED DESCRIPTION

Figure 1:
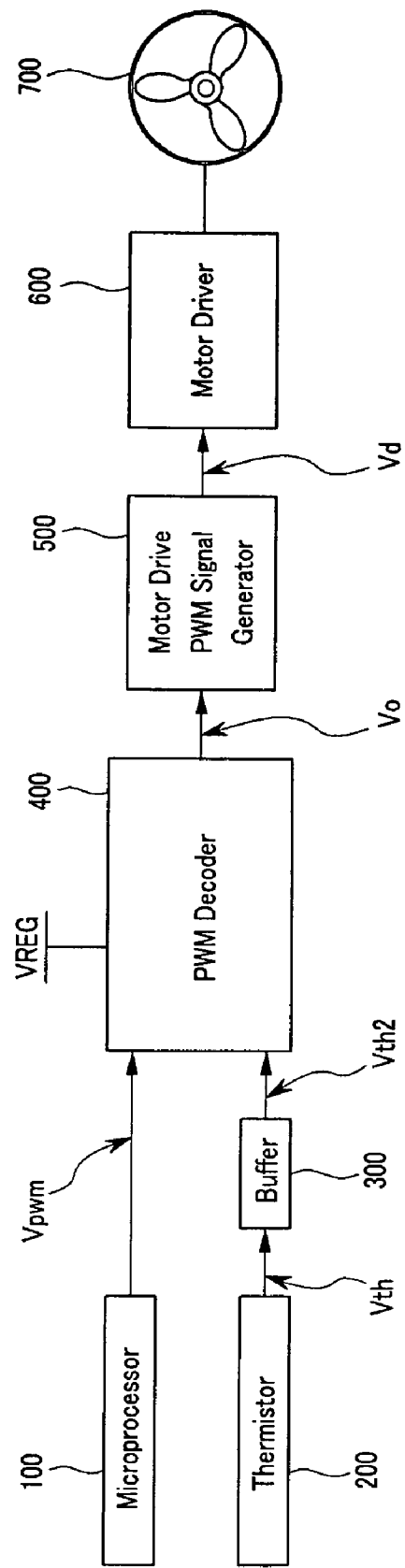
FIG. 1 shows a block diagram for a motor control system according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Similar parts in the specification are indicated by similar reference numerals.

Figure 2:
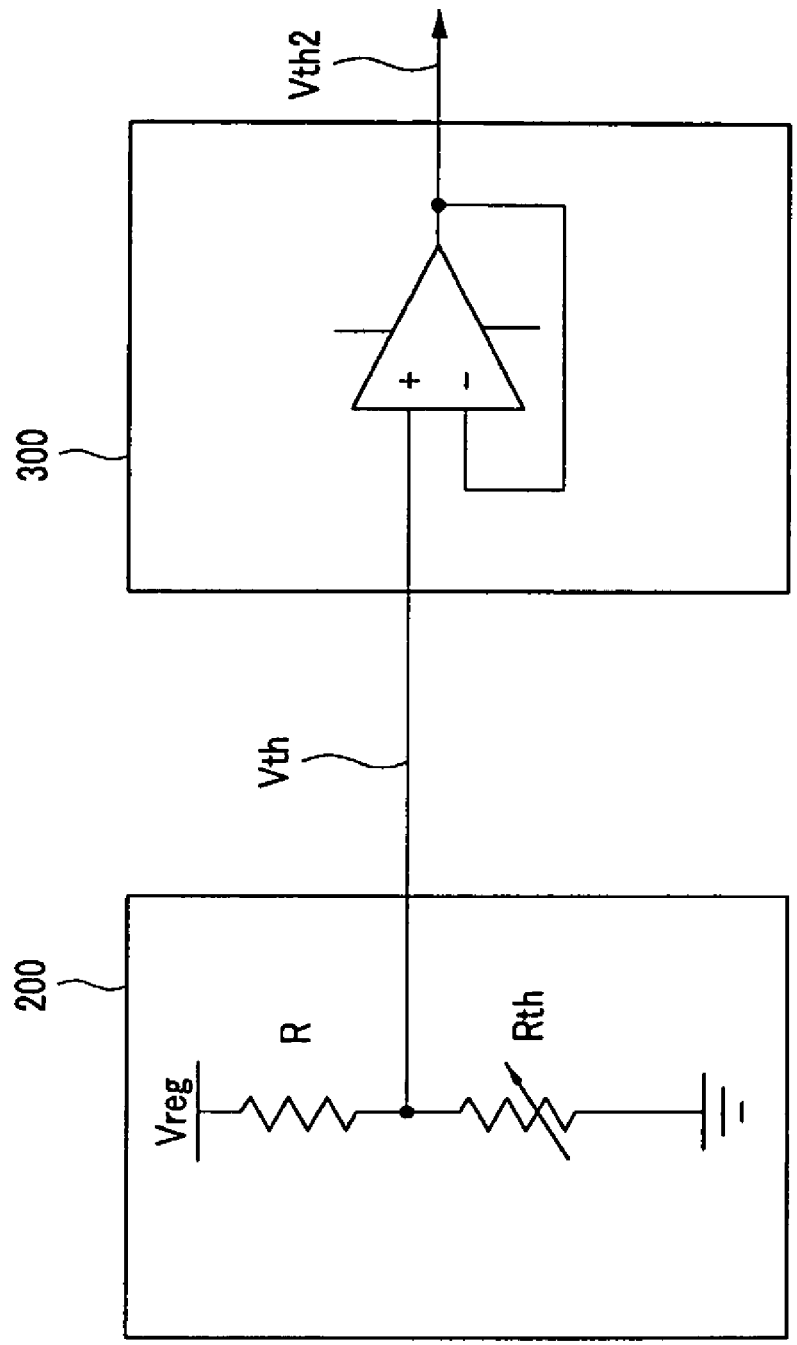
FIG. 2 shows a schematic diagram for a thermistor circuit and a buffer according to an embodiment of the present invention.

Referring to FIG. 1 to FIG. 3, a system for controlling a motor rpm according to the temperature will now be described.

FIG. 1 shows a block diagram for a motor control system according to an embodiment. The motor control system includes a microprocessor 100, a thermistor circuit 200, a buffer 300, a pulse width modulation (PWM) decoder 400, a motor drive PWM signal generator 500, a motor driver 600, and a cooling fan 700.

Microprocessor 100 generates pulse width modulation signal Vpwm with a duty ratio which may include temperature information. Microprocessor 100 can be a CPU, an integrated circuit (IC), or any circuit for generating pulse width modulation signal Vpwm according to the temperature. Pulse width modulation signal Vpwm including the temperature information can be a signal with a duty ratio that increases when the temperature increases, or a signal with a duty ratio that decreases when the temperature increases.

Thermistor circuit 200 generates a thermistor voltage signal Vth according to the variation of temperature. In some embodiments thermistor circuit 200 can include any circuit which is operable to generate a voltage signal Vth having different voltage values according to the variation of temperature. In some embodiments the thermistor voltage signal Vth can have a low voltage value as the temperature increases, in other embodiments it can have a high voltage value as the temperature increases.

FIG. 2 shows a schematic diagram of thermistor circuit 200 and buffer 300. Thermistor circuit 200 has a resistor R having a terminal coupled to a predetermined reference voltage Vreg, and a thermistor Rth having a terminal coupled to the ground. Thermistor Rth is placed in a position to measure an inner temperature of the system to be cooled. The other terminals of resistor R and thermistor 200 are coupled at a thermistor node. The voltage of the thermistor node is the thermistor voltage signal Vth. Thermistor voltage signal Vth is determined by Eq. 1:

$$Vth = \frac{Rth}{R + Rth} \qquad (1)$$

In embodiments including an NTC thermistor, Vth decreases with increasing temperature, since thermistor resistance Rth decreases with increasing temperature. The reduction of thermistor resistance Rth caused by the increase of temperature is generally nonlinear. Furthermore, thermistor resistance Rth appears both in the numerator and in the denominator in Eq. 1. At least for these reasons the dependence of Vth on the temperature is nonlinear. Because of this nonlinear characteristics, cooling fan control systems which sense the temperature by a thermistor, often operate cooling fan 700 at an rpm faster than necessary for stabilizing the system. Such operation has excessive power consumption and noise.

To address these problems, in embodiments cooling fan 700 is controlled by thermistor voltage signal Vth, which depends on the variation of temperature, and a PWM modulation signal Vpwm, whose duty ratio depends on the temperature.

Thermistor voltage signal Vth is inputted into buffer 300. Buffer 300 generates a second thermistor voltage (Vth2) by maintaining the thermistor voltage signal Vth generated by thermistor circuit 200 irrespective of the impedance of the load of thermistor circuit 200. Buffer 300 can include a comparator in some embodiments, or equivalent circuits. In some embodiments buffer 300 may be absent.

PWM modulation signal Vpwm, second thermistor voltage Vth2, and reference voltage Vreg are inputted into pulse width modulation decoder 400. Pulse width modulation decoder 400 generates an output voltage Vo, whose value depends on characteristics of the inputted voltages. These characteristics may include the duty ratio of the inputted voltages. In some embodiments a high value of output voltage Vo indicates a high rpm of cooling fan 700, in others a low rpm.

Analogous embodiments can be used to control other cooling devices, such as water coolers, which cool by circulating water instead of air.

Motor drive PWM signal generator 500 receives output voltage Vo from pulse width modulation decoder 400 and generates at least one PWM signal Vd for driving cooling fan 700.

Figure 3A:
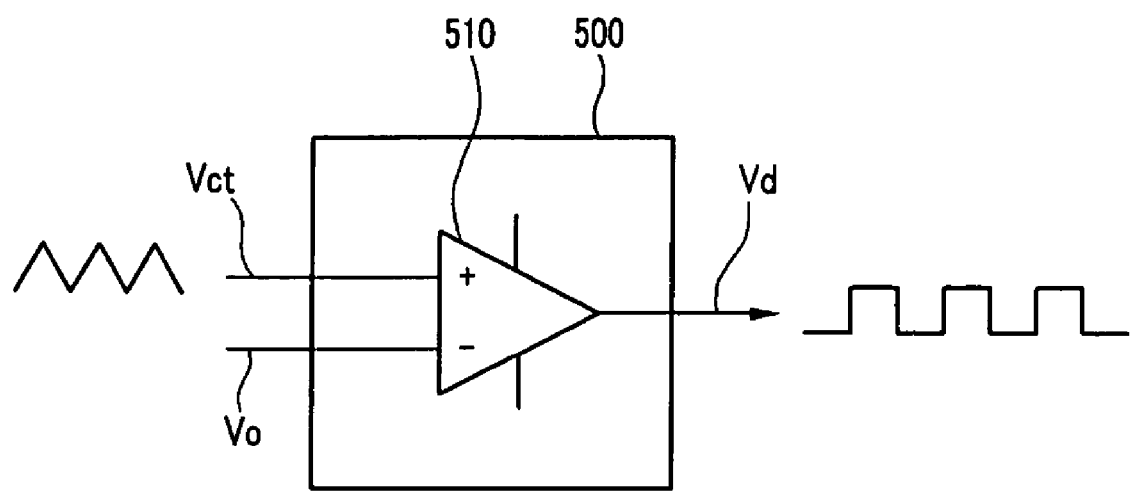
FIG. 3A shows a schematic diagram for a motor driving PWM signal generator according to an embodiment of the present invention.

FIG. 3A shows an embodiment of motor drive PWM signal generator 500. In this embodiment a high output voltage Vo indicates a low rpm of cooling fan 700, and a high duty ratio of motor drive PWM signal Vd indicates a high rpm, as explained below in detail.

Motor drive PWM signal generator 500 includes a comparator 510 for generating motor drive PWM signal Vd. Comparator 510 receives a pulse signal Vct at a non-inverting input terminal and output voltage Vo at an inverting input terminal.

Figure 3B:
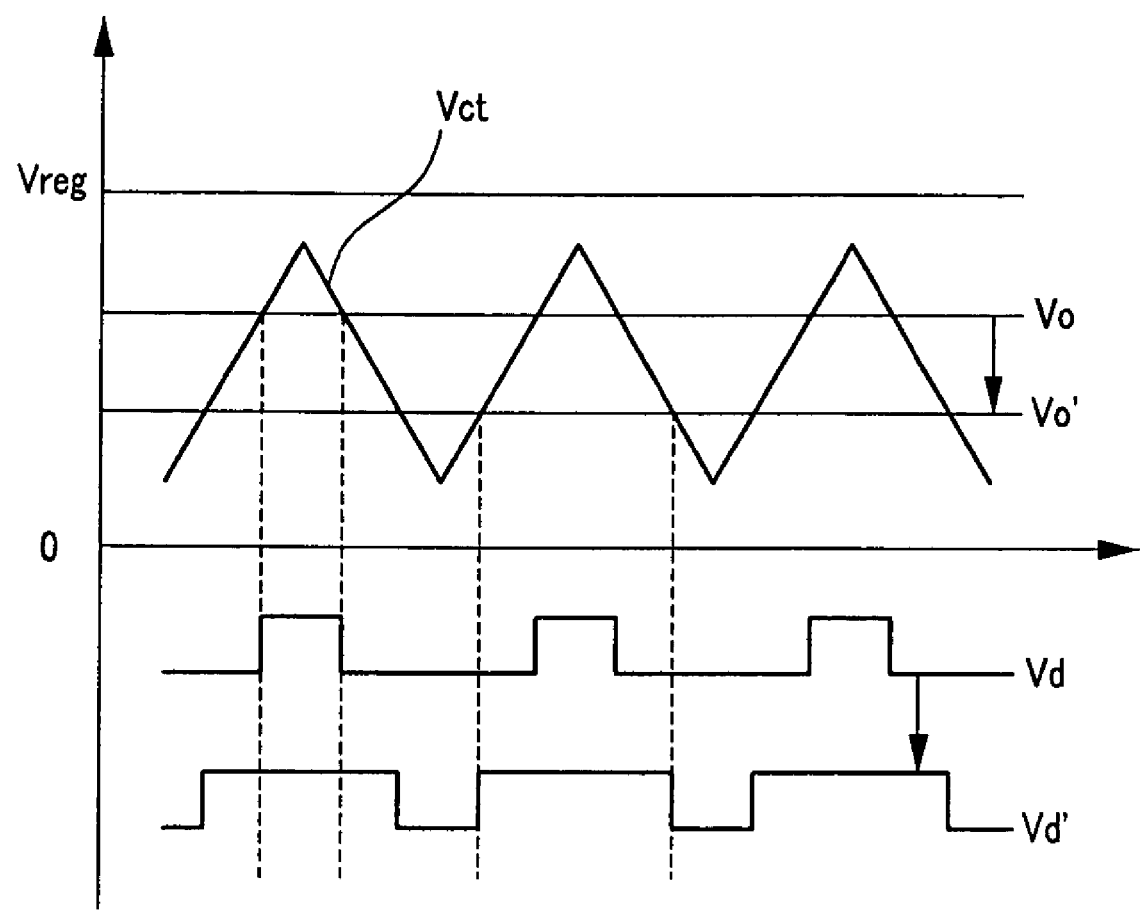
FIG. 3B shows the input and the output of the motor driving PWM signal generator of FIG. 3A.

FIG. 3B shows the waveforms of the voltages. Comparator 510 outputs motor driving PWM signal Vd with a duty ratio determined by the inputted voltages Vo and Vct.

The operation of comparator 510 will now be illustrated. When the temperature rises above a reference temperature, microprocessor 100 changes the duty ratio of voltage Vpwm. When the temperature rises, the duty ratio of voltage Vpwm may increase or may decrease.

In response to the changed duty ratio of Vpwm, pulse width modulation decoder 400 reduces output voltage Vo to a lower value Vo'. Comparator 510 receives reduced output voltage Vo' and generates motor driving PWM signal Vd' with an increased duty ratio, as shown. This increases the rpm of cooling fan 700.

Referring to FIG. 1, in some embodiments motor driver 600 generates a power signal for driving cooling fan 700 based on motor driving PWM signal Vd. An increased duty ratio of motor driving PWM signal Vd' generates a higher power signal, increasing the rpm of cooling fan 700.

Cooling fan 700 is operated by the power signal to control cooling of the system. In cooling systems, which use cooling devices other than a cooling fan, motor drive PWM signal generator 500 and motor driver 600 can be substituted with other components. In other words, motor drive PWM signal generator 500 and motor driver 600 are operated as a cooling device driver and can be substituted by any other cooling device driver.

FIGS. 4A-C and FIG. 5 illustrate embodiments of pulse width modulation decoder 400.

Figure 4A:
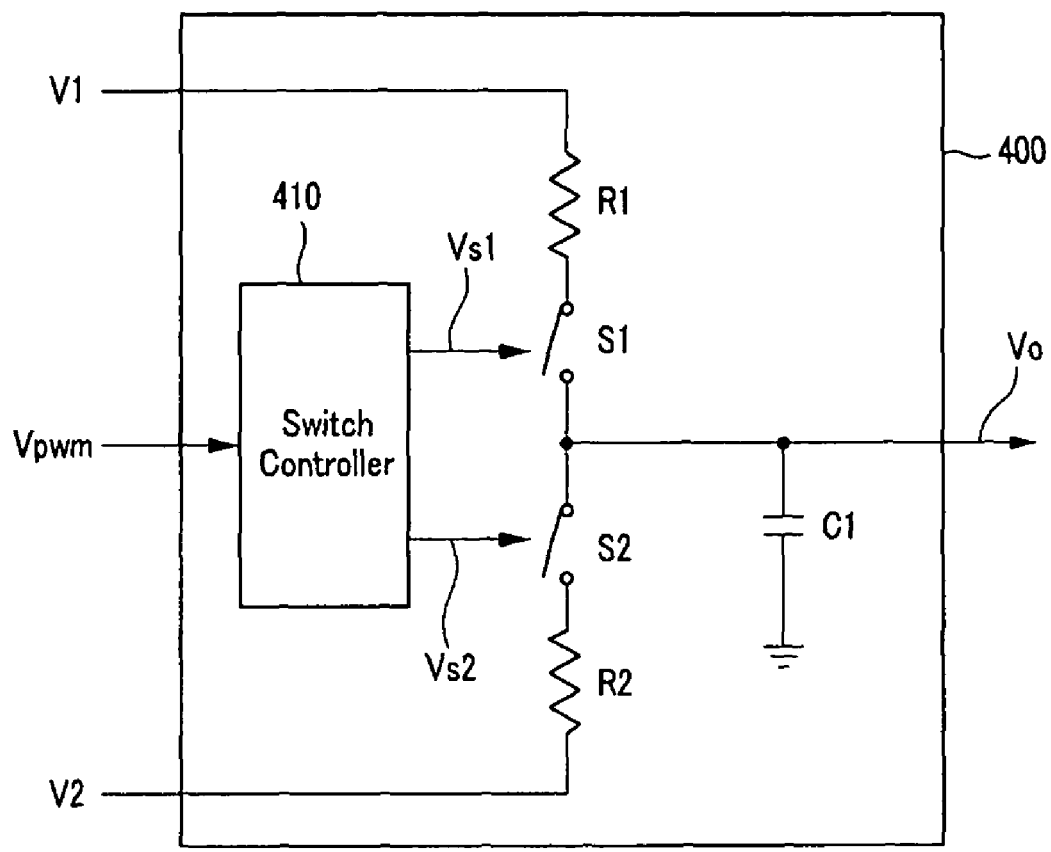
FIG. 4A shows a first circuit diagram for a pulse width modulation decoder according to an embodiment of the present invention.

FIG. 4A shows a first embodiment of pulse width modulation decoder 400. Pulse width modulation decoder 400 includes a first resistor R1 having a terminal coupled to a first voltage V1, a second resistor R2 having a terminal coupled to a second voltage V2, a first switch S1 coupled to first resistor R1, a second switch S2 coupled to second resistor R2, a switch controller 410 for controlling first switch S1 and second switch S2, and a capacitor C1 coupled to a joint output terminal of first switch S1 and second switch S2.

Switch controller 410 receives pulse width modulation signal Vpwm with a duty ratio depending on the temperature, and controls the turn on/off first switch S1 and second switch S2.

Capacitor C1 is charged or discharged by first voltage V1 when first switch S1 is turned on, and it is charged or discharged by second voltage V2 when second switch S2 is turned on. The resistance of first resistor R1 and second resistor R2, and capacitance of capacitor C1 determine the charging or discharging rate.

When the rate for charging or discharging capacitor C1 is lowered by appropriately controlling the resistance of first resistor R1, the resistance of second resistor R2 and the capacitance of capacitor C1, the high frequency components of output voltage Vo are eliminated. Output voltage Vo is determined according to the ratio of the time when first switch S1 is turned on and the time when second switch S2 is turned on. In other words, first resistor R1, second resistor R2 and capacitor C1 are operated as a low pass filter of output voltage Vo.

In some embodiments, first voltage V1 can be e.g. reference voltage Vreg and second voltage V2 can be thermistor voltage signal Vth or second thermistor voltage Vth2. In other embodiments other voltages are applied as V1 and V2.

Figure 4B:
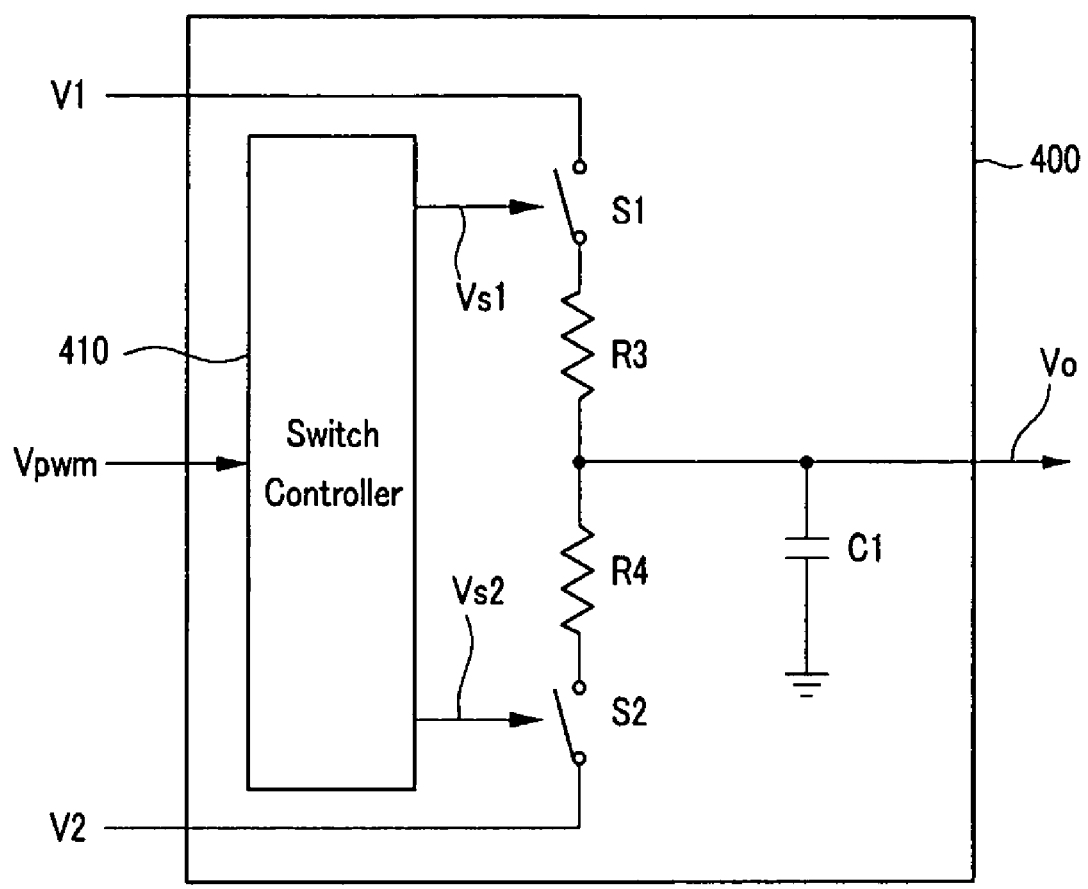
FIG. 4B shows a second circuit diagram for a pulse width modulation decoder according to an embodiment of the present invention.

FIG. 4B shows a second embodiment of pulse width modulation decoder 400. In this embodiment the location of resistor R1 and switch S1 is exchanged, and the location of resistor R2 and switch S2 is exchanged relative to the embodiment of FIG. 4A.

Figure 4C:
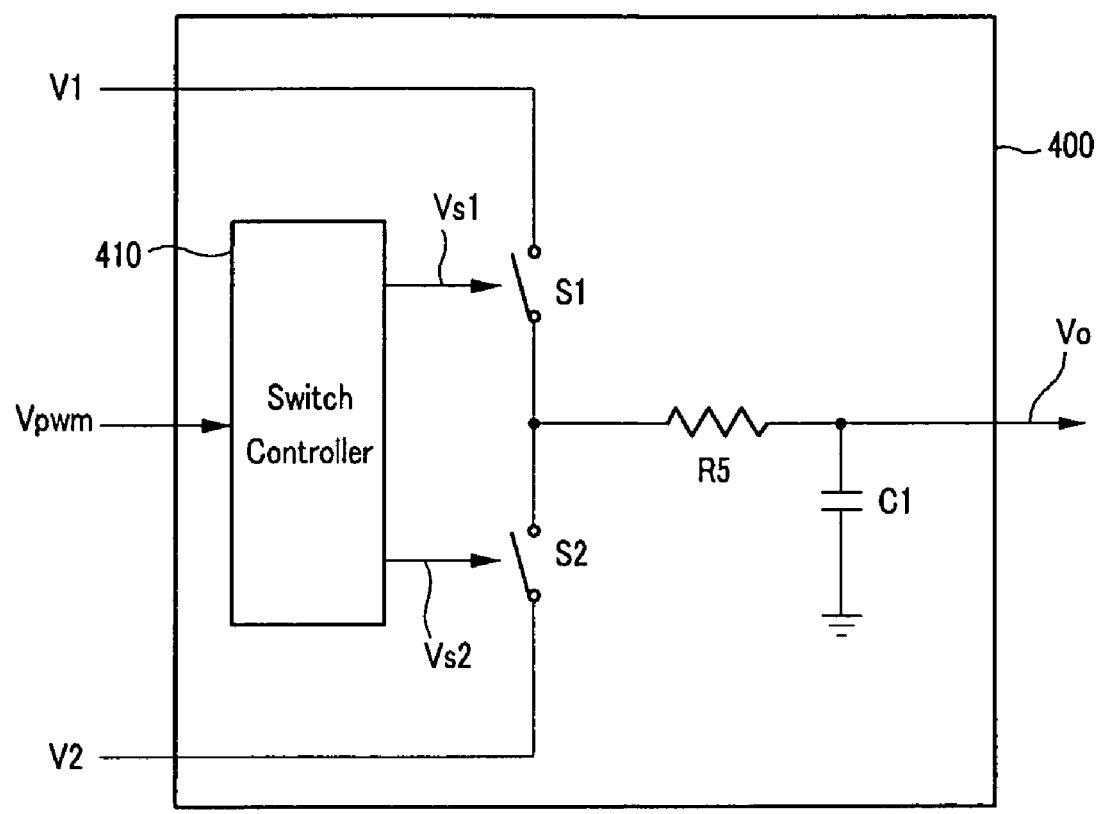
FIG. 4C shows a third circuit diagram for a pulse width modulation decoder according to an embodiment of the present invention.

FIG. 4C shows a third embodiment of pulse width modulation decoder 400. Pulse width modulation decoder 400 shown in FIG. 4C includes a low pass filter having a resistor and a capacitor at the output terminal. It does not include first resistor R1 and second resistor R2. The low pass filter smoothes output voltage Vo of pulse width modulation decoder 400. Various types of low pass filters can be used in this embodiment instead of the illustrated low pass filter having a resistor R4 and capacitor C1.

Figure 5:
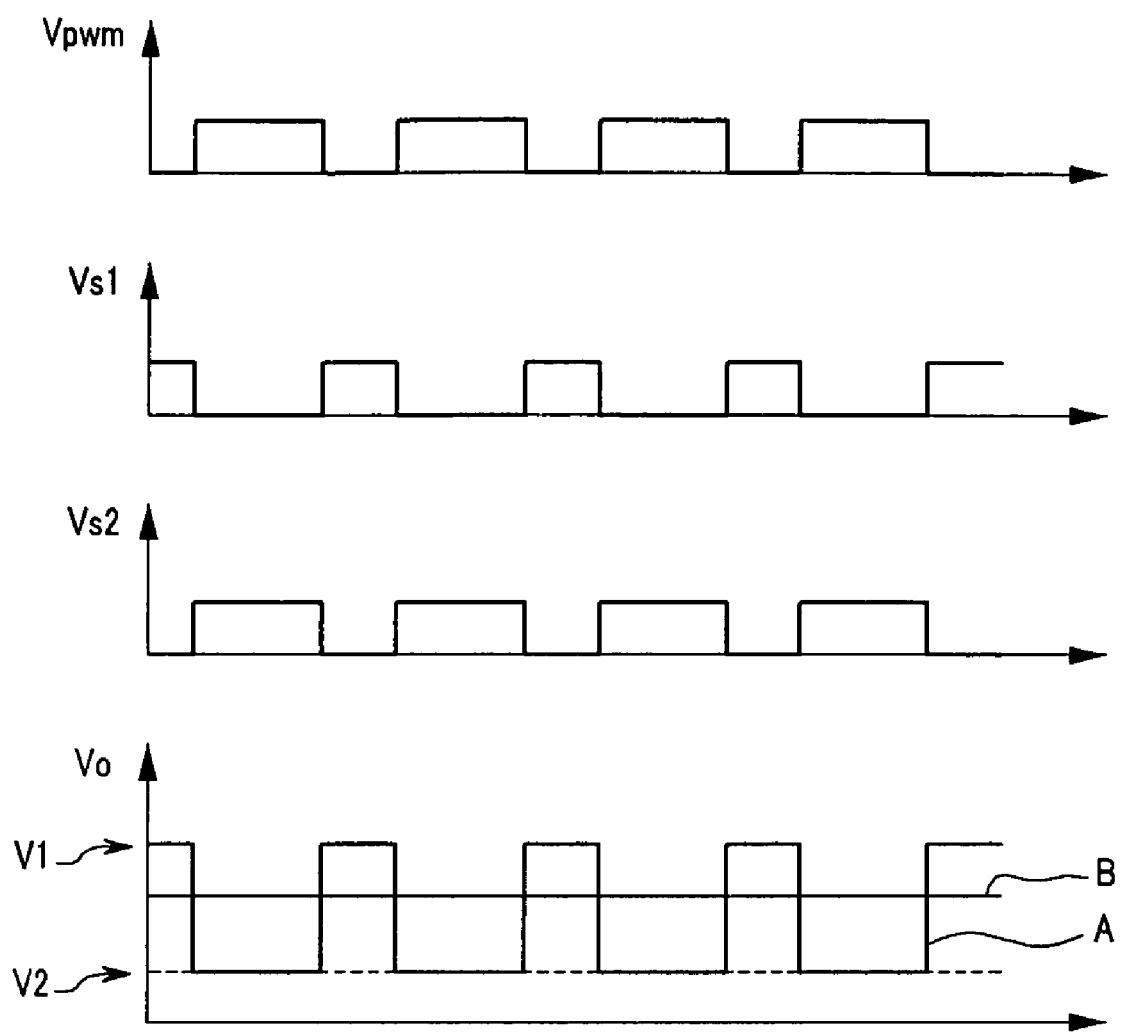
FIG. 5 shows a waveform diagram for signals at respective units of the pulse width modulation decoder according to an embodiment of the present invention.

FIG. 5 shows waveforms of various voltages to illustrate the operation of the cooling control system. In this embodiment switch controller 410 is configured so that first switch S1 is turned on when pulse width modulation signal Vpwm is LO and second switch S2 is turned on when Vpwm is HI. Signals Vs1 and Vs2 operate switches S1 and S2 according to pulse width modulation signal Vpwm.

When first voltage V1 is greater than second voltage V2, output voltage Vo is given by waveform A in embodiments without a capacitor C1. In embodiments with capacitor C1 output voltage Vo is smoothed to waveform B. In this embodiment with capacitor C1, output voltage Vo is given by Eq. 2:

$$Vo = (1-D) \cdot V1 + D \cdot V2 \qquad (2)$$

Here the duty ratio of pulse width modulation signal Vpwm is denoted by D. Nominally the duty ratio of turning on first switch S1 and second switch S2 is 1−D and D.

However, in some embodiments these rates can be varied. It is possible to modify the duty ratios for turning on the switches to D1=1−D−a and D2=D−a. These values are less than 1−D and D by 'a', preventing the first switch and the second switch from being turned on concurrently. Visibly, D1+D2 is less than 1.

Further, it is also possible to establish the rates for turning on the switches to be D1 (=1−D+a) and D2 (=D+a) which are greater than 1−D and D as much as 'a' so as to prevent the first switch and the second switch from being turned off concurrently. Here, D1+D2 is greater than 1.

When the rates for turning on first switch S1 and second switch S2 are D1 and D2, output voltage Vo is given by Eq. 3:

$$Vo = D1 \cdot V1 + D2 \cdot V2 \qquad (3)$$

Various embodiments will now be described with reference to FIGS. 6-9.

Figure 6:
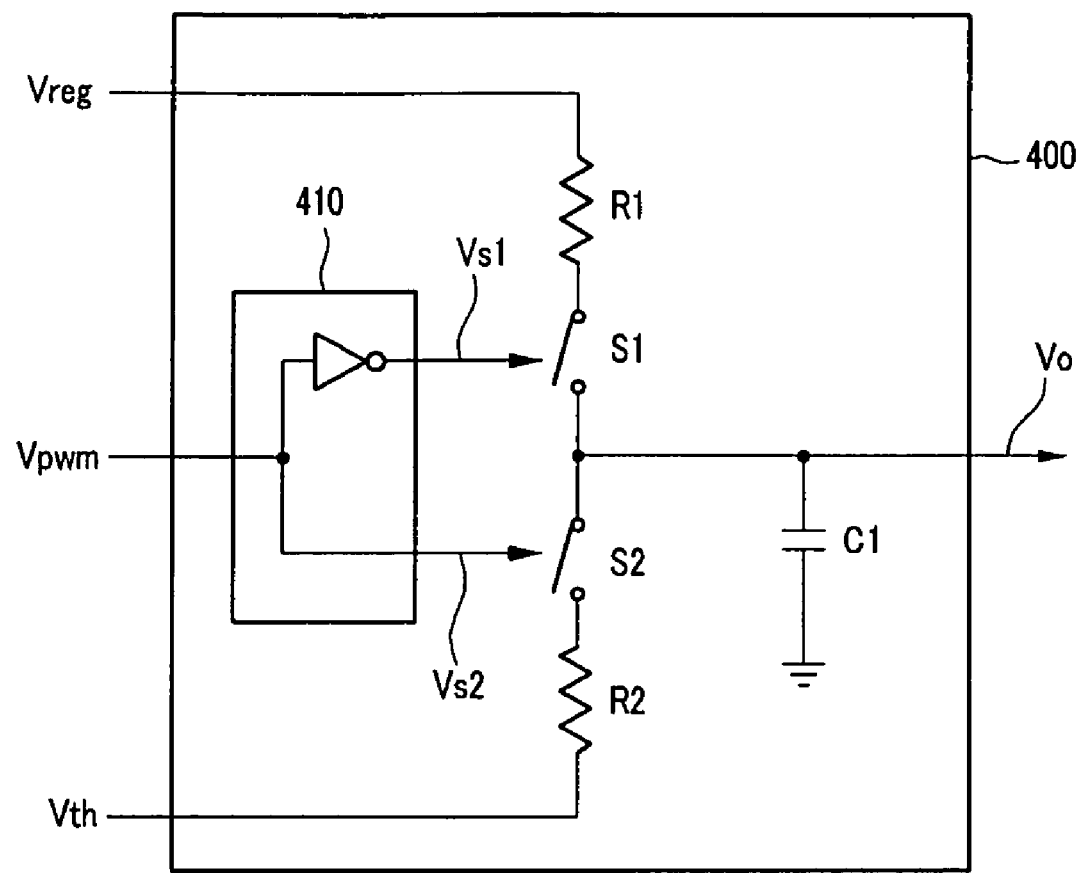
FIG. 6 shows a schematic diagram for a pulse width modulation decoder according to a first embodiment of the present invention.

FIG. 6 shows a schematic diagram for pulse width modulation decoder 400. Pulse width modulation decoder 400 includes first resistor R1, second resistor R2, first switch S1, second switch S2, switch controller 410, and capacitor C1.

Switch controller 410 includes a NOT gate, thus it provides an inverted pulse width modulation input signal Vpwm to first switch S1 and pulse width modulation input signal Vpwm to second switch S2.

As an illustration, pulse width modulation input signal Vpwm is defined to be a signal in which the duty ratio D increases when the temperature sensed by microprocessor 100 is greater than a reference temperature. The duty ratio D decreases when the temperature is less than a second reference temperature. The second reference temperature can be equal to or different from the above reference temperature.

Reference voltage Vreg is essentially constant, irrespective of conditions such as the temperature. Reference voltage Vreg is coupled to a first terminal of first resistor R1. For example, reference voltage Vreg can be a voltage provided by a regulated power source.

V2 voltage at the first terminal of second resistor R2 is either thermistor voltage signal Vth, generated by thermistor 200, or second thermistor voltage Vth2, generated by buffer 300. Both voltages are essentially independent of the output impedance. Since thermistor Rth of thermistor circuit 200 is electrically coupled to reference voltage Vreg through resistor R, thermistor voltage signal Vth is less than reference voltage Vreg.

Output voltage Vo of pulse width modulation decoder 400 is given by Eq. 4:

$$Vo = (1-D) \cdot Vreg + D \cdot Vth \qquad (4)$$

The operation of pulse width modulation decoder 400 in an embodiment of will now be described.

Figure 7:
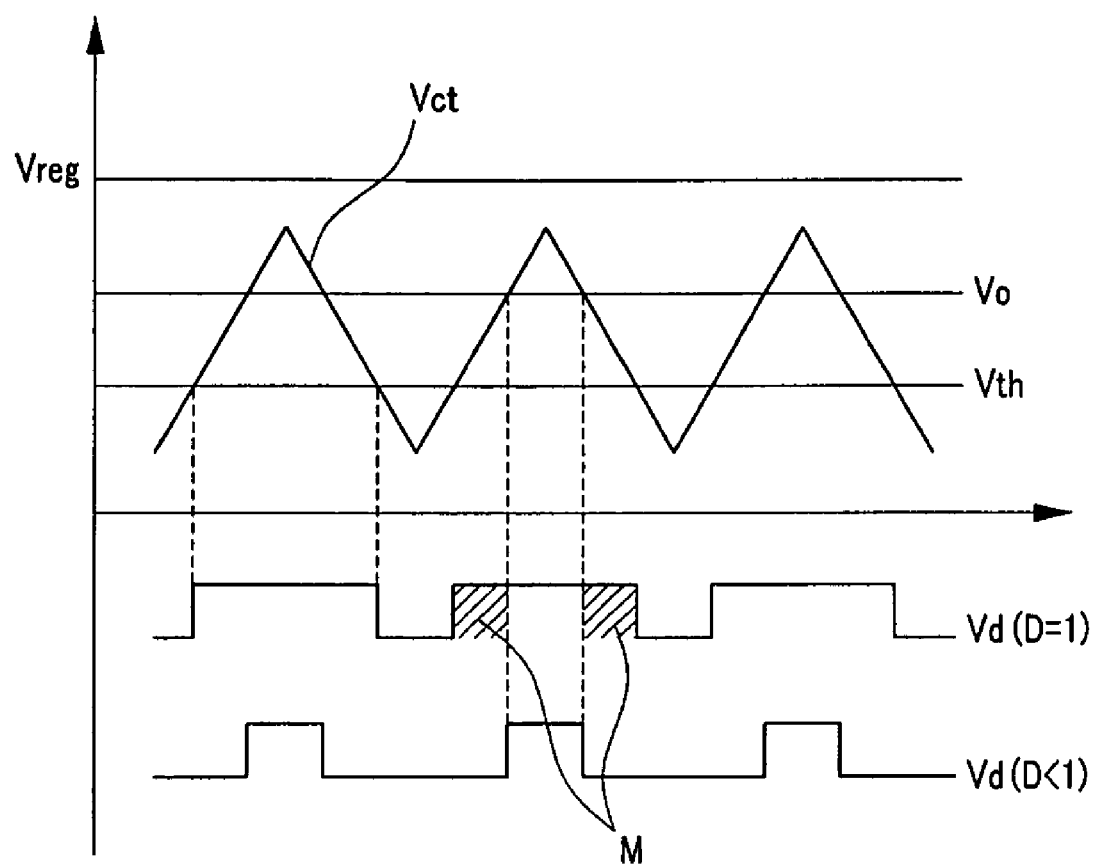
FIG. 7 shows a waveform diagram for signals at respective units according to a first embodiment of the present invention.

FIG. 7 shows signal waveforms for various voltages in an embodiment. Thermistor voltage signal Vth decreases when the temperature of the system increases. Conversely, Vth increases when the temperature of the system decreases.

Output voltage Vo assumes values between reference voltage Vreg and thermistor voltage signal Vth, depending on duty ratio D.

Motor drive PWM signal generator 500 compares output voltage Vo and pulse signal Vct to generate a motor driving PWM signal Vd. Vd causes the rpm of cooling fan 700 to increase as output voltage Vo decreases.

If the duty ratio D is set to 1, pulse width modulation input signal Vpwm, representing the temperature of microprocessor 100, does not influence output voltage Vo.

In this case, output voltage Vo of pulse width modulation decoder 400 corresponds only to thermistor voltage signal Vth. Thus, the rpm of cooling fan 700 is determined according to the temperature of the system indicated by thermistor voltage signal Vth. Since thermistor voltage signal Vth depends on the temperature in a non-linear manner, in many existing architectures the rpm of cooling fan 700 is designed to exceed the rpm necessary to stabilize the temperature of the system. This excess is labeled by M in FIG. 7.

In embodiments, the excess M of the rpm is eliminated by reducing the duty ratio D of pulse width modulation signal Vpwm below 1 by microprocessor 100.

In detail, when the temperature of microprocessor 100 is less than a temperature appropriate for stabilizing microprocessor 100, microprocessor 100 reduces the duty ratio D of pulse width modulation signal Vpwm. Pulse width modulation decoder 400 receives pulse width modulation signal Vpwm with the reduced duty cycle and reduces the operational rpm of cooling fan 700 to an appropriate value.

Thus, in some embodiments the temperature of microprocessor 100 and the temperature of another location is measured by Vpwm and Vth, respectively, and these two voltages together determine the rpm of cooling fan 700.

Figure 8:
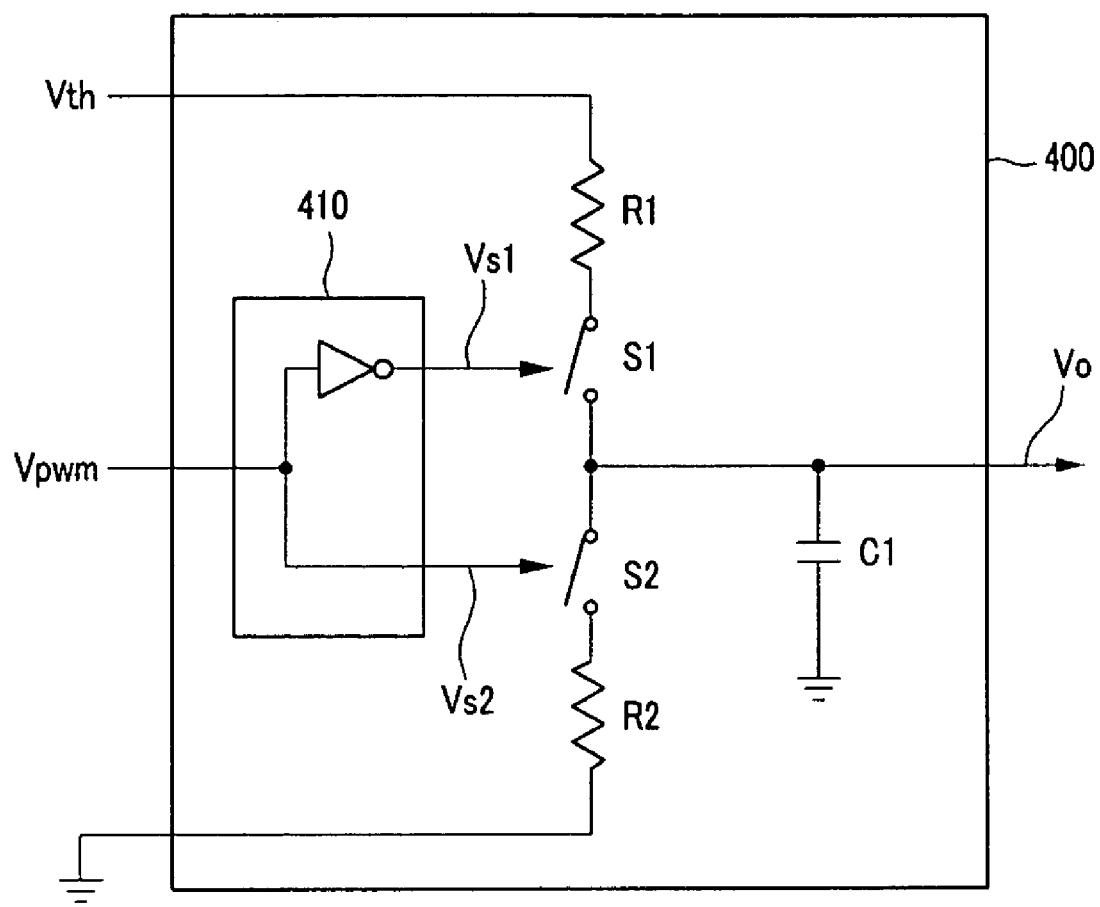
FIG. 8 shows a schematic diagram for a pulse width modulation decoder according to a second embodiment of the present invention.

FIG. 8 shows a schematic diagram of pulse width modulation decoder 400 according to an embodiment. Pulse width modulation decoder 400 includes first resistor R1, second resistor R2, first switch S1, second switch S2, switch controller 410, and capacitor C1.

Switch controller 410 includes a NOT gate and it is provided with a pulse width modulation signal Vpwm. It provides an inverted pulse width modulation signal Vs1 to first switch S1. It also provides a pulse width modulation signal Vs2 to second switch S2.

The duty ratio D of pulse width modulation signal Vpwm increases when the temperature sensed by microprocessor 100 is greater than a reference temperature. Duty ratio D can decrease when the temperature is less than a second reference temperature.

The input voltage applied to a first terminal of resistor R1 can be thersmistor voltage signal Vth, or second thermistor voltage Vth2. In either case, the input voltage is essentially independent of the output impedance. Thermistor Rth of thermistor circuit 200 is positioned to measure an inner temperature of the system. Since thermistor Rth of thermistor circuit 200 is electrically coupled to reference voltage Vreg through resistor R, thermistor voltage signal Vth is less than reference voltage Vreg.

In this embodiment a terminal of second resistor R2 is coupled to the ground. Output voltage Vo of pulse width modulation decoder 400 in this embodiment is given by Eq. 5:

$$Vo=(1-D)\cdot Vth \quad (5)$$

The operation of pulse width modulation decoder 400 will now be described with reference to FIG. 9.

Figure 9:
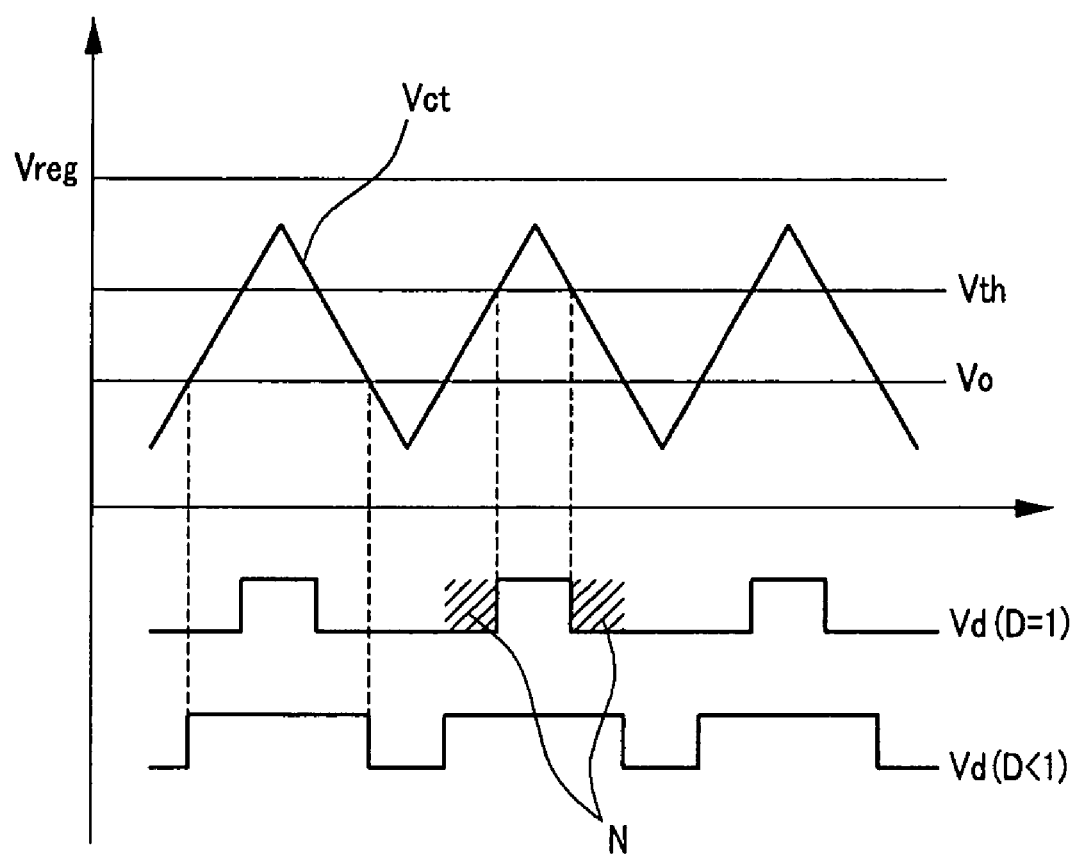
FIG. 9 shows a waveform diagram for signals at respective units according to a second embodiment of the present invention.

FIG. 9 shows various signal waveforms according to a second embodiment. Thermistor voltage signal Vth decreases when the temperature of the system increases, and Vth increases when the temperature of the system decreases below reference voltage Vreg.

Output voltage Vo assumes values between thermistor voltage signal Vth and 0, depending on duty ratio D.

Motor drive PWM signal generator 500 compares output voltage Vo and motor driving PWM signal generating pulse signal Vct to generate a motor driving PWM signal Vd. The rpm of cooling fan 700 increases as output voltage Vo decreases.

In detail, when the duty ratio is set to D=1, the temperature of microprocessor 100 is not reflected in output voltage Vo. Therefore, output voltage Vo corresponds to thermistor voltage signal Vth, and therefore the rpm of cooling fan 700 corresponds to the temperature of the system as indicated by thermistor voltage Vth.

In this case, the rpm of cooling fan 700 is designed to be slightly less than the rpm for stabilizing the system. An insufficient portion N of the rpm is filled by the duty ratio D of pulse width modulation signal Vpwm.

In detail, when the measured temperature of microprocessor 100 is greater than an appropriate temperature for stabilizing microprocessor 100, microprocessor 100 generates a pulse width modulation signal Vpwm with a higher duty ratio D increase the rpm of cooling fan 700. Pulse width modulation decoder 400 receives pulse width modulation signal Vpwm and reduces output voltage Vo accordingly. The reduced output voltage Vo increases the operational rpm of cooling fan 700 to an appropriate value. This stabilizes the temperature of microprocessor 100.

Pulse width modulation decoder 400 and the cooling device controller of the described embodiments avoid operating the cooling device excessively by controlling the cooling device using additional temperature sensing information besides the nonlinear temperature sensing information of thermistor 200. Noise and power consumption is reduced since the cooling device is not excessively operated.

Also, pulse width modulation decoder 400 and the cooling device controller are easy to realize and they can be manufactured on a single IC because of their simple configuration.

While this invention has been described in connection with specific embodiments, it is to be understood that the invention is not limited to the disclosed embodiments, but, on the contrary, is intended to cover various modifications and equivalent arrangements included within the spirit and scope of the appended claims.

What is claimed is:

1. A cooling device controller for controlling a cooling device for reducing a temperature of a system, the cooling device controller comprising:
   a capacitor coupled to an output terminal for supplying an output voltage that depends on temperature;
   a first switch between a first input terminal and the output terminal, wherein a predetermined reference voltage is applied to the first input terminal and the capacitor is charged or discharged at the output terminal by the predetermined reference voltage when the first switch is turned on;
   a second switch between a second input terminal and the output terminal, wherein a temperature-sensing voltage is applied to the second input terminal and the capacitor is charged or discharged at the output terminal by the temperature-sensing voltage when the second switch is turned on, the temperature-sensing voltage varying according to information for a first sensed temperature; and
   a switch controller, operable to receive a first voltage waveform having a pulse width modulation with a duty ratio, the duty ratio dependent on information for a second sensed temperature,
   wherein the switch controller is operable to turn on and off the first switch and the second switch based on the first voltage waveform to generate the output voltage that depends on the predetermined reference voltage and the temperature-sensing voltage according to the duty ratio.

2. The cooling device controller of claim 1, wherein the switch controller turns on the first switch when the first voltage waveform assumes a first voltage value and turns on the second switch when the first voltage waveform assumes a second voltage value.

3. The cooling device controller of claim 2, wherein the duty ratio of the first voltage waveform increases when the second sensed temperature is greater than a reference temperature for stabilizing the system.

4. The cooling device controller of claim 3, wherein the temperature-sensing voltage at the second input terminal decreases as the temperature increases, and the maximum of the temperature-sensing voltage is less than the reference voltage.

5. The cooling device controller of claim 3, wherein the temperature-sensing voltage at the second input terminal decreases as the temperature increases, and the minimum of the temperature-sensing voltage is greater than the reference voltage.

6. The cooling device controller of claim 5, wherein
the predetermined reference voltage is a voltage level that corresponds to a ground voltage.

7. The cooling device controller of claim 6, wherein
the temperature-sensing voltage is applied by a circuit including a thermistor.

8. The cooling device controller of claim 7, further comprising a buffer for maintaining a buffer voltage level of the temperature-sensing voltage.

9. The cooling device controller of claim 6, wherein
the output voltage is utilized for controlling the cooling device.

10. The cooling device controller of claim 1, further comprising at least one of:
   a first resistor coupled in series with the first switch between the first input terminal and a first terminal of the capacitor; and
   a second resistor coupled in series with the second switch between the second input terminal and the first terminal of the capacitor.

11. The cooling device controller of claim 1, wherein at least one of the information for the first sensed temperature and the information for the second sensed temperature varies non-linearly with temperature.

* * * * *